United States Patent
Kim et al.

(10) Patent No.: US 9,202,764 B2
(45) Date of Patent: Dec. 1, 2015

(54) APPARATUS AND METHOD FOR REMOVING DEFECT

(75) Inventors: Moo Seong Kim, Seoul (KR); Min Young Hwang, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 49 days.

(21) Appl. No.: 14/128,372

(22) PCT Filed: Jun. 13, 2012

(86) PCT No.: PCT/KR2012/004664
§ 371 (c)(1),
(2), (4) Date: Dec. 20, 2013

(87) PCT Pub. No.: WO2012/177013
PCT Pub. Date: Dec. 27, 2012

(65) Prior Publication Data
US 2014/0120638 A1    May 1, 2014

(30) Foreign Application Priority Data

Jun. 20, 2011 (KR) .................. 10-2011-0059869
Jun. 24, 2011 (KR) .................. 10-2011-0061630

(51) Int. Cl.
| H01L 21/00 | (2006.01) |
| H01L 21/66 | (2006.01) |
| H01L 21/02 | (2006.01) |
| H01L 29/16 | (2006.01) |

(52) U.S. Cl.
CPC .......... *H01L 22/12* (2013.01); *H01L 21/02052* (2013.01); *H01L 21/02057* (2013.01); *H01L 22/20* (2013.01); *H01L 29/1608* (2013.01)

(58) Field of Classification Search
CPC ................ H01L 21/02046; H01L 21/02052; H01L 21/02057; H01L 21/02065
USPC ................................................ 438/4, 12, 16
See application file for complete search history.

(56) References Cited

U.S. PATENT DOCUMENTS

2004/0031503 A1*  2/2004  Eitoku ........................... 134/2
2010/0093177 A1*  4/2010  Kozasa et al. ................ 438/704

FOREIGN PATENT DOCUMENTS

| JP | 2008-308381 A | 12/2008 |
| KR | 10-1996-0007641 B1 | 6/1996 |
| KR | 10-2008-0088915 A | 10/2006 |
| KR | 10-2007-0079528 A | 8/2007 |

OTHER PUBLICATIONS

International Search Report in International Application No. PCT/KR2012/004664, filed Jun. 13, 2012.

* cited by examiner

*Primary Examiner* — Kevin M Picardat
(74) *Attorney, Agent, or Firm* — Saliwanchik, Lloyd & Eisenschenk

(57) ABSTRACT

An apparatus for removing a defect according to the embodiment includes an image processing part for observing a surface of a substrate; a layer forming part for forming a layer on the surface of the substrate; and a humidity controlling part for controlling humidity in a chamber in which the substrate is placed. A method for removing a defect according to the embodiment includes detecting the defect on a surface of a substrate; forming an oxide layer by oxidizing the defect; and removing the oxide layer. A method for removing a defect according to another embodiment includes forming an oxide layer on an entire surface of a substrate; and removing the oxide layer to remove the defect.

11 Claims, 2 Drawing Sheets

APPARATUS AND METHOD FOR REMOVING DEFECT

CROSS-REFERENCE TO RELATED APPLICATIONS

This application is the U.S. national stage application of International Patent Application No. PCT/KR2012/004664, filed Jun. 13, 2012, which claims priority to Korean Application Nos. 10-2011-0059869, filed Jun. 20, 2011, and 10-2011-0061630, filed Jun. 24, 2011, the disclosures of each of which are incorporated herein by reference in their entirety.

TECHNICAL FIELD

The disclosure relates to an apparatus and a method for removing a defect.

BACKGROUND ART

Various types of defects exist on surfaces of a silicon-carbide wafer and an epitaxial wafer. Such defects increase a surface roughness of the silicon-carbide wafer, causing a bad influence upon the subsequent processes. A surface defect on the silicon-carbide wafer results in another defect in growing a single crystal layer and causes a rough surface. The surface defect on the epitaxial wafer may cause a partial isolation in laminating several layers. Further, when a device is fabricated using such a wafer, a leakage current may be increased by non-uniformity of metal electrode deposition and patterns.

For this reason, the life span of a device may be reduced and reliability of the device may be lowered. Thus, it is very important in manufacturing a high quality device to remove and control such a defect.

DISCLOSURE OF INVENTION

Technical Problem

The embodiment provides an apparatus and a method for removing a defect using oxidization.

Solution to Problem

According to the embodiment, an apparatus for removing a defect includes an image processing part for observing a surface of a substrate; a layer forming part for forming a layer on the surface of the substrate; and a humidity controlling part for controlling humidity in a chamber in which the substrate is placed.

According to the embodiment, a method for removing a defect includes detecting the defect on a surface of a substrate; forming an oxide layer by oxidizing the defect; and removing the oxide layer.

According to another embodiment, a method for removing a defect includes forming an oxide layer on an entire surface of a substrate; and removing the oxide layer to remove the defect.

Advantageous Effects of Invention

An apparatus for removing a defect according to an embodiment includes an atomic force microscope (AFM). A defect may be locally removed through the AFM. That is, the defect may be oxidized by using the AFM and the oxidized defect may be easily removed. Thus, a surface roughness of a substrate may be improved and the substrate having a high quality may be provided. Further, a performance of a device having such a substrate may be improved.

According to the embodiment, a method for removing such a defect with high efficiency can be provided.

MODE FOR THE INVENTION

Figure 1:
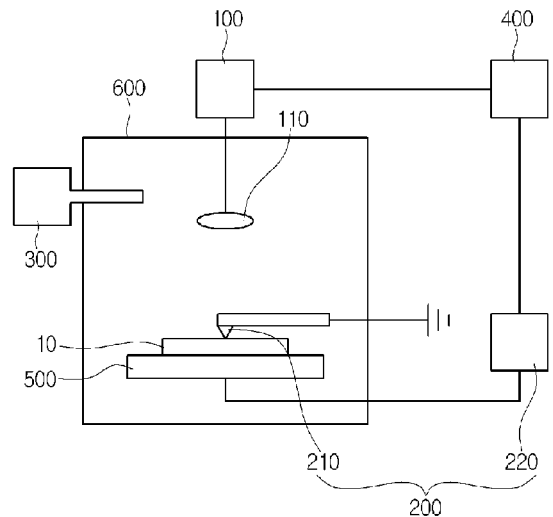
FIG. 1 is a schematic view of an apparatus for removing a defect according to an embodiment.

In the description of the embodiments, it will be understood that, when a layer (or film), a region, a pattern, or a structure is referred to as being "on" or "under" another substrate, another layer (or film), another region, another pad, or another pattern, it can be "directly" or "indirectly" over the other substrate, layer (or film), region, pad, or pattern, or one or more intervening layers may also be present. Such a position of the layer has been described with reference to the drawings.

The thickness and size of each layer (or film) shown in the drawings may be exaggerated, omitted or schematically drawn for the purpose of convenience or clarity. In addition, the size of elements does not utterly reflect an actual size.

Hereinafter, an embodiment of the present invention will be described in detail with reference to accompanying drawings as follows.

First, an apparatus for removing a defect according to an embodiment will be described in detail with reference to FIG. 1. FIG. 1 is a schematic view of an apparatus for removing a defect according to an embodiment.

Referring to FIG. 1, an apparatus for removing a defect according to an embodiment includes an image processing part 100, a layer forming part 200, a stage 500, a humidity controlling part 300, a controller 400, and a chamber 600.

The image processing part 100 may observe a surface of a substrate 10 placed in the chamber 600. The image processing part 100 may further include a lens 110 to observe the surface of the substrate 10.

The image processing part 100 may take an image of the surface of the substrate 10. The image processing part 100 may include an image sensor including a charge-coupled device (CCD).

Distribution of defects 12 which exist on the surface of the substrate 10 may be checked through the image processing part 100.

The image processing part 100 may take an image of the surface of the substrate 10 and may generate coordinates of all areas in the image. Thus, a position of the defect 12 may be exactly detected. Further, the defect 12 may be locally removed through the image processing part 100.

The layer forming part 200 may form the layer on the surface of the substrate 10. In detail, the layer forming part 200 may form the layer on a portion of the surface of the substrate 10. In more detail, a protrusion may be placed on the surface of the substrate 10, and the layer forming part 200 may locally form the layer on the protrusion. At this time, the protrusion may be the defect 12. That is, the protrusion may include the defect 12 existing on the surface of the substrate 10.

The layer forming part 200 may form the protrusion by taking a thickness and a height of the defect 12, which are detected through the image processing part 100, into consideration.

The layer forming part 200 may include a voltage applying part which may apply a voltage to the substrate 10. The voltage applying part may generate the voltage between the surface of the substrate 10 and the protrusion.

The voltage applying part may include a probe part 210 and a power supplying part 220.

The probe part 210 may be placed on the substrate 10.

The probe part 210 may include an atomic force microscope (AFM).

Generally, the AFM is equipment which can obtain a 3-dimensional surface image at the atomic level and is used for taking an image of the surface of the substrate 10 without any damage to the substrate 10. The AFM can detect a surface structure of the substrate 10 in a nano-scale using an interaction force (which includes all stimulations, such as electric and magnetic stimulations, generated by various energy sources) between the surface of the substrate 10 and a probe.

Meanwhile, nano-lithography is an important application field of the AFM. The nano-lithography is a technology which adjusts the alignment of atoms and molecules on the surface of the substrate 10 by applying a suitable signal between the probe part 210 and the surface of the substrate 10 corresponding to deformation force (such as electric and magnetic stimulations) of the surface of the substrate 10, such that an ultra-micro pattern can be formed on the substrate 10. In the lithography using the AFM, a driving voltage is applied to the stage 500 to move the substrate 10 placed on the stage 500, to move the substrate 10 relative to the probe part 210 or to move the AFM probe part 210 relative to the substrate 10. Meanwhile, in the state that the probe part 210 relatively moves on the substrate 10 or the AFM probe part 210 moves relative to the substrate 10, if a lithography voltage is applied, an electric field or a magnetic field is generated between the probe part 210 and the substrate 10, so that force (such as electric and magnetic stimulations) is applied to the surface of the substrate 10. As a result, the surface of the substrate 10 is modified due to physical/chemical variations so that a pattern 20 is formed on the surface of the substrate 10.

The power supplying part 220 applies a voltage to the probe part 210 and the substrate 10. In detail, the power supplying part 220 may apply a voltage between the probe part 210 and the stage 500 supporting the substrate 10.

An oxide layer 14 may be formed on the protrusion using the voltage applying part.

The stage 500 may be placed in the chamber 600. The stage 500 may support the substrate 10. A voltage may be applied to the stage 500.

Next, the humidity controlling part 300 may control humidity in the chamber 600 in which the substrate 10 is placed. The humidity controlling part 300 may keep the humidity in the chamber 600 at about 40% to about 90%.

The chamber 600 may receive the substrate 10 therein.

The controller 400 may control the image processing part 100, the layer forming part 200 and the humidity controlling part 300. Thus, the optimum environment for forming an oxide layer 14 may be created.

The defect 12 may be locally removed through the apparatus for removing the defect according to the embodiment. That is, using the AFM, the defect 12 may be oxidized and the oxidized defect 12 may be easily removed. Thus, a surface roughness of the substrate 10 may be improved and the substrate 10 having a high quality may be provided. In addition, a performance of a device using the substrate 10 may be improved.

Hereinafter, a method for removing a defect according to an embodiment will be described with reference to FIGS. 2 to 7. For the purpose of clarity and simplicity, description about the elements and structures that have been previously described will be omitted.

Figure 2:
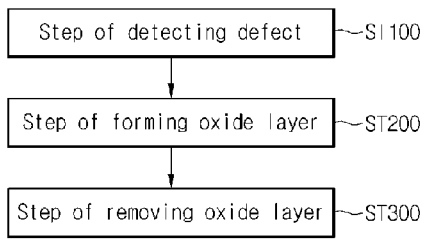
FIG. 2 is a process flowchart of a method for removing a defect according to an embodiment.
Figure 3:
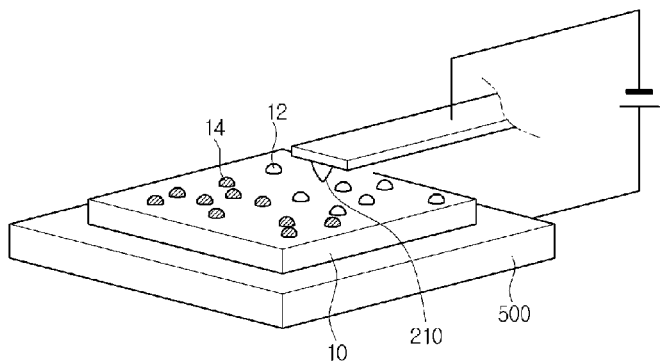
FIG. 3 is a schematic view for explaining a method for removing a defect according to an embodiment.
Figure 4:
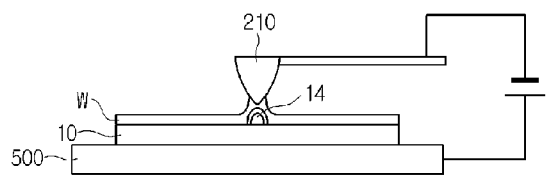
FIG. 4 is a schematic view for explaining a basic principle of a method for removing a defect according to an embodiment.
Figure 5:
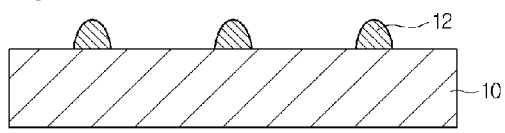
FIGS. 5 to 7 are sectional views for explaining a method for removing a defect according to an embodiment.
Figure 6:
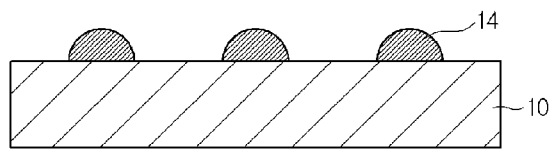
Figure 7:

FIG. 2 is a process flowchart of the method for removing the defect according to the embodiment. FIG. 3 is a schematic view for explaining the method for removing the defect according to an embodiment. FIG. 4 is a schematic view for explaining a basic principle of the method for removing the defect according to an embodiment. FIGS. 5 to 7 are sectional views for explaining the method for removing the defect according to the embodiment.

Referring to FIG. 2, the method for removing the defect according to the embodiment includes a step of ST100 of detecting the defect, a step ST200 of forming an oxide layer, and a step ST300 of removing the oxide layer.

In the step ST100 of detecting the defect, the defect 12 placed on the surface of the substrate 10 may be detected. In the step ST100 of detecting the defect, an image sensor including a charge-coupled device (CCD) may be used.

Referring to FIGS. 3 and 5, the defect 12 having a shape protruding from a surface of the substrate 10 may exist.

In the step ST200 of forming the oxide layer, the defect 12 may be oxidized. In detail, referring to FIGS. 3 and 4, a voltage may be applied between the probe part 210 placed on the defect 12 and the substrate 10 to oxidize the defect 12.

A voltage of 6 V to 14 V may be applied between the probe part 210 and the substrate 10. In the embodiment, since only a portion having the defect 12 is locally oxidized in the surface of the substrate 10, a high voltage is not requested.

However, the embodiment is not limited thereto, and a voltage of 2 V to 25 V may be applied between the probe part 210 and the substrate 10 such that the oxide layer can be formed on the entire surface of the substrate 10.

The oxide layer 14 may be formed by applying various voltages according to distribution of defects 12 existing on the substrate 10 and types of the defects 12.

The step ST200 of forming the oxide layer may include the step of keeping the humidity of 40% to 90%. In the step ST200 of forming the oxide layer, water may be shallowly formed on the surface of the substrate 10 by keeping high humidity. That is, a thin water layer W may be formed on the surface of the substrate 10. The thin water layer W may become a reaction source for forming the oxide layer 14 on the defect 12 later.

Further, in the step ST200 of forming the oxide layer, the shape of the formed oxide layer 14 may be maintained by keeping high humidity.

If the voltage between the probe part 210 and the substrate 10 is increased, an electric field is increased at a portion at which the surface of the substrate 10 makes contact with an end edge of the probe part 210. At this time, if the electric field is increased, an anion (OH—) tunneling is increased between the probe part 210 and the substrate and the following chemical reaction is accelerated.

Under the electric field, the chemical reaction at the probe part 210 is expressed as following chemical formula 1.

$$4H_2O + 4e^- \rightarrow 2H_2\uparrow + 4OH^- \quad \text{Chemical formula 1}$$

Under the electric field, the chemical reaction at the surface of the substrate 10 is expressed as following chemical formulas 2 and 3

$$Si + 2H_2O + 4h^+ \rightarrow SiO_2 + 4H^+ \quad \text{Chemical Formula 2}$$

$$2H_2O + 4h^+ \rightarrow O_2\uparrow + 4H^+ \quad \text{Chemical Formula 3}$$

Due to the chain reaction of chemical formulas 1 to 3, $H_2O$ is generated as following chemical formula 4.

$$4H^+ + 4OH^- \rightarrow 2H_2O \quad \text{Chemical Formula 4}$$

The oxide layer 14 may be formed on the defect 12 through the chemical formulas 1 to 4. As depicted in FIG. 6, the oxide layer 14 may be formed on the surface of the defect 12, and inner portions of the defect 12 may be oxidized. Further, tunneled anions (OH$^-$) cause the chemical reactions to be more actively performed, so that higher oxide pattern is formed.

Next, referring to FIG. 7, the step ST300 of removing the oxide layer may be performed. The step ST300 of removing the oxide layer may include a step of dipping the substrate 10 in a hydrofluoric acid (HF) solution. Thus, the oxide layer 14 may be removed so that the defect 12 can be removed. Therefore, the quality of the substrate 10 may be improved and the surface roughness of the substrate 10 may be enhanced. Further, the performance of the device having the substrate 10 may be improved.

Figure 8:
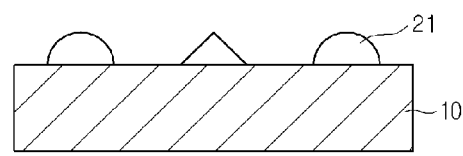
FIGS. 8 to 10 are views for explaining a method for removing a defect on a wafer according to another embodiment.
Figure 9:
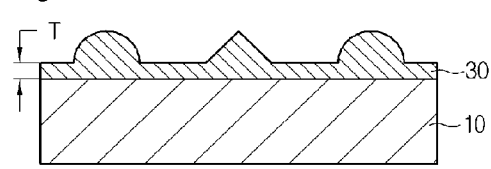
Figure 10:
Figure 11:
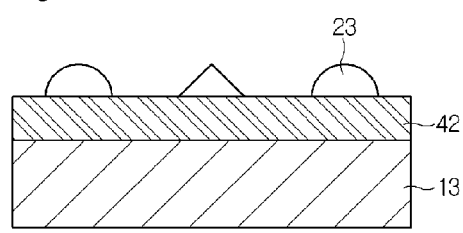
FIGS. 11 to 13 are views for explaining a method for removing a defect on an epitaxial wafer according to still another embodiment.
Figure 12:
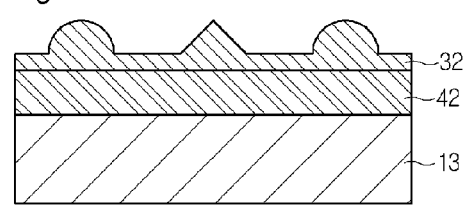
Figure 13:
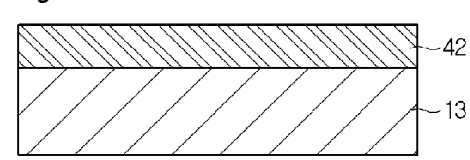

Hereinafter, a method for removing a defect according to another embodiment will be described with reference to FIGS. 8 to 13. FIGS. 8 to 10 are views for explaining a method for removing a defect on a wafer according to another embodiment. FIGS. 11 to 13 are views for explaining a method for removing a defect on an epitaxial wafer according to another embodiment.

Referring to FIGS. 8 to 10, a method for removing a defect according to another embodiment may include the steps of forming an oxide layer 30 and removing the defect 21.

In the step of forming the oxide layer 30, the oxide layer 30 may be formed on a surface of a substrate. The substrate may be a wafer 10. That is, the substrate may be the wafer 10 before growth of an epitaxial layer.

A defect 21 may exist on a surface of the wafer. The defect 21 may protrude from the surface of the wafer 10. The defect 21 increases a surface roughness of the wafer, causing a bad influence upon the subsequent processes. The surface defect 21 on the wafer 10 results in another defect in growing a single crystal layer and causes a rough surface.

In the step of forming the oxide layer 30, the oxide layer may be formed on the entire surface of the wafer 10. Thus, in the step of forming the oxide layer 30, the defects 21 existing on the surface of the wafer 10 may be oxidized.

The step of forming the oxide layer 30 may include a plasma oxidizing step. According to the plasma oxidizing, a voltage is applied to both of a positive electrode and a negative electrode of an electrolyte to generate plasma, so that a layer is formed on a surface by a reaction between the plasma and a metal. In the embodiment, the oxide layer 30 may be formed on the surface of the wafer 10 by generating ozone plasma. The plasma oxidizing has a merit that it can form a uniform oxide layer 30.

The plasma oxidizing step may be performed for 5 minutes to 30 minutes. Further, in the plasma oxidizing step, a voltage of 500 V to 1000 V may be applied. Thus, the surface of the wafer 10 may be effectively oxidized.

A thickness T of the oxide layer 30 may be 0.05 um to 1 um. When the thickness T of the oxide layer 30 is below 0.05 um, the thickness may be insufficient to oxidize the defects 21 existing on the surface of the wafer 10. When the oxide layer 30 having the thickness T exceeding 1 um is formed, the defects 21 existing on the surface of the wafer 10 may be too big or too many detects 21 may exist, so that the value of use of the wafer 10 may be lowered.

The thickness of the oxide layer 30 may vary depending on an oxidizing time, plasma intensity and an applied voltage.

The step of removing the defect 21 may include the step of etching the oxide layer 30. That is, the defect 21 may be removed by etching the oxide layer 30. The etching step may be performed through a general wet or dry etching method.

By removing the defect 21, the quality of the wafer 10 and the surface roughness of the wafer 10 may be improved. Further, an epitaxial layer having a high quality may grow from the wafer 10. Therefore, a performance of a device employing the wafer 10 may be improved.

Referring to FIGS. 11 to 13, a defect 23 existing on a surface of the epitaxial wafer, which is fabricated by forming an epitaxial layer 42 on a wafer 13, may be removed by the above-described method.

When several epitaxial layers 42 are laminated, a surface defect 23 on an epitaxial wafer may cause a local isolation. Further, in fabricating a device using the wafer 13, due to metal electrode deposition and non-uniformity of a pattern, a leakage current may be increased, resulting in the degradation of the life span and the reliability of the device.

Therefore, a surface defect 23 on the epitaxial layer 42 may be removed and a surface roughness may be improved through the method of removing the defect according to the embodiment. Thus, the epitaxial layer 42 having the high quality may be obtained.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

The invention claimed is:

1. An apparatus for removing a defect, the apparatus comprising:
   an image processing part for observing a surface of a silicon-carbide substrate;
   a layer forming part for forming a layer on the surface of the silicon-carbide substrate; and a humidity controlling part for controlling humidity in a chamber in which the silicon-carbide substrate is placed;

wherein the image processing part comprises a lens and an image sensor including a charge-coupled device (CCD), wherein the layer forming part includes a voltage applying part for applying a voltage to the silicon-carbide substrate, wherein the voltage applying part comprises:

a probe part on the silicon-carbide substrate; and a power supplying part for applying the voltage to the probe and the silicon-carbide substrate;

wherein the probe part includes an atomic force microscope (AFM).

2. The apparatus of claim 1, wherein the layer forming part forms the layer on a part of the surface.

3. The apparatus of claim 1, wherein a protrusion is formed on the surface of the silicon-carbide substrate and the layer forming part forms the layer on the protrusion.

4. The apparatus of claim 3, wherein the protrusion includes the defect.

5. The apparatus of claim 1, wherein the voltage applying part generates the voltage between the surface of the silicon-carbide substrate and the protrusion.

6. A method for removing a defect, the method comprising:

detecting the defect on a surface of a silicon-carbide substrate;

forming an oxide layer by oxidizing the defect; and removing the oxide layer;

wherein the detecting the defect comprises sensing with an image sensor including a charge-coupled device (CCD);

wherein a probe part is placed on the defect, and the forming of the oxide layer comprises applying a voltage between the silicon-carbide substrate and the probe part;

wherein the probe part includes an atomic force microscope (AFM); and wherein the forming of the oxide layer comprises maintaining humidity in a range of 40% to 90%.

7. The method of claim 6, wherein the voltage is in a range of 2 V to 25 V.

8. The method of claim 6, wherein the voltage is in a range of 6 V to 14 V.

9. The method of claim 6, wherein the removing of the oxide layer comprises dipping the silicon-carbide substrate in an HF solution.

10. A method for removing a defect, the method comprising:

forming an oxide layer on an entire surface of a silicon-carbide substrate; and removing the oxide layer to remove the defect;

wherein a thickness of the oxide layer is in a range of 0.05 um to 1 um, wherein the forming of the oxide layer includes plasma oxidizing, and wherein the plasma oxidizing includes applying a voltage in a range of 500 V to 1000 V.

11. The method of claim 10, wherein the removing of the defect includes etching the oxide layer.

* * * * *